United States Patent
Ooi

(10) Patent No.: US 7,733,251 B2
(45) Date of Patent: Jun. 8, 2010

(54) A/D CONVERTION CONTROLLING DEVICE AND IMAGE FORMING APPARATUS

(75) Inventor: Masashi Ooi, Miyagi (JP)

(73) Assignee: Ricoh Company, Limited, Tokyo (JP)

( * ) Notice: Subject to any disclaimer, the term of this patent is extended or adjusted under 35 U.S.C. 154(b) by 76 days.

(21) Appl. No.: 12/232,247

(22) Filed: Sep. 12, 2008

(65) Prior Publication Data
US 2009/0073019 A1    Mar. 19, 2009

(30) Foreign Application Priority Data
Sep. 13, 2007  (JP)  ............................. 2007-238239
Jul. 17, 2008  (JP)  ............................. 2008-186425

(51) Int. Cl.
*H03M 1/06*    (2006.01)

(52) U.S. Cl. ..................... 341/118; 341/119; 341/120; 341/121; 341/139; 341/140; 358/444; 358/445; 358/446; 358/461; 358/463

(58) Field of Classification Search ......... 341/118–121, 341/139, 140, 142, 155; 358/444, 445, 461, 358/463
See application file for complete search history.

(56) References Cited

U.S. PATENT DOCUMENTS

| | | | | |
|---|---|---|---|---|
| 5,179,379 A | * | 1/1993 | Allen et al. | 341/118 |
| 5,204,761 A | * | 4/1993 | Gusmano | 358/461 |
| 6,166,668 A | * | 12/2000 | Bautista et al. | 341/118 |
| 6,292,120 B1 | * | 9/2001 | Painchaud et al. | 341/139 |
| 6,407,685 B1 | * | 6/2002 | Handel et al. | 341/120 |
| 6,665,096 B1 | * | 12/2003 | Oh | 358/461 |
| 6,717,542 B2 | * | 4/2004 | Harada | 341/161 |
| 6,741,194 B1 | * | 5/2004 | Cassagnes et al. | 341/118 |
| 6,903,670 B1 | * | 6/2005 | Lee et al. | 341/118 |
| 7,122,767 B2 | | 10/2006 | Sato et al. | |
| 7,642,947 B2 | * | 1/2010 | Suzuki et al. | 341/169 |
| 2004/0080439 A1 | * | 4/2004 | Van Der Mee | 341/139 |
| 2008/0291072 A1 | * | 11/2008 | Sano | 341/158 |
| 2009/0147089 A1 | * | 6/2009 | Tonkikh | 348/207.99 |

FOREIGN PATENT DOCUMENTS

| | | |
|---|---|---|
| JP | 2005-026830 | 1/2005 |
| JP | 2005-062334 | 3/2005 |

* cited by examiner

*Primary Examiner*—Linh V Nguyen
(74) *Attorney, Agent, or Firm*—Harness, Dickey & Pierce, P.L.C.

(57) ABSTRACT

A reference voltage generating unit generates a plurality of analog reference voltages, and an A/D converting unit converts the analog reference voltages thus generated and an analog input voltage input from an external device to digital reference values. A CPU generates, based on the analog reference voltages and the digital reference values converted from the analog reference voltages, an equation for correcting the analog input voltage to be converted to a digital value falling in a range of the digital reference values. With the equation generated, the CPU calculates the analog input voltage for the digital value obtained by conversion.

7 Claims, 12 Drawing Sheets

# A/D CONVERTION CONTROLLING DEVICE AND IMAGE FORMING APPARATUS

CROSS-REFERENCE TO RELATED APPLICATIONS

The present application claims priority to and incorporates by reference the entire contents of Japanese priority document 2007-238239 filed in Japan on Sep. 13, 2007 and Japanese priority document 2008-186425 filed in Japan on Jul. 17, 2008.

BACKGROUND OF THE INVENTION

1. Field of the Invention

The present invention relates to an analog-to-digital (A/D) conversion controlling device for converting digital voltage to analog voltage in an image forming apparatus.

2. Description of the Related Art

A fixing roller used in an electrophotographic image forming apparatus is heated to a predetermined temperature by a fixing heater employing a halogen heater or the like that generates heat by power supplied from an external power source (a commercial power supply). When an input power source can afford to supply sufficient power depending on its power usage, for example, in an idle state, the input power source charges a rechargeable auxiliary power source, such as an electric double layer capacitor. When required power is not sufficiently supplied from the input power source alone, the fixing heater is heated by the power charged in the auxiliary power source, so that the heating of the fixing roller is supported.

In view of energy saving, a system has been developed that stops the operation performed by a fixing heater that consumes high power in an idle state, and that restores the operation by drawing power from both an external power source and an auxiliary power source, so as to heat (warm up) the fixing roller in a short time. When the fixing roller is heated in a short time, an ambient temperature of the fixing roller and a temperature of a pressure roller that presses a recording medium are not sufficiently increased. As a result, when an image is formed immediately after the warming-up, the heat of the fixing roller is dissipated to the recording medium and the pressure roller, causing quick temperature drop in the fixing roller. In particular, when the ambient temperature is low for long hours, the temperatures of the recording medium and the pressure roller become low, causing the temperature drop more likely. When the voltage at the external power source is low, a low voltage is applied to the fixing heater. As a result, the heater generates less heat, causing the temperature drop in the fixing roller more likely.

Such temperature drop in the fixing roller during image formation immediately after the warming-up following the idle state has been addressed using a system that aids to heat the fixing roller by operating a fixing heater that draws power from an auxiliary power source also when the temperature drop occurs in the fixing roller. To address both the warming-up and the temperature drop in the fixing roller with all required conditions, the auxiliary power source needs to have a larger capacitance to supply more power. However, this poses problems with increased charging time, power, and cost, and with a limitation on the mountable size.

Assume that, due to the limitation on the mountable size of the auxiliary power source, the auxiliary power source is controlled based on the temperature of the fixing roller, and used to heat the fixing roller during the warming-up. In this case, the warming-up takes time, for example, when voltage drop occurs in input source voltage or in a low temperature environment. This causes the auxiliary power source to burn up an increased amount of power. As a result, sufficient power may not be left for addressing the temperature drop in the fixing roller during image formation immediately after the warming-up.

To solve these problems, a method has been proposed that includes detecting voltages of an external power source and an auxiliary power source, an ambient temperature, temperatures of a fixing roller and a pressure roller, and the like; determining, for restoration, an optimal distribution of usage power of the auxiliary power source between usage for warming up the fixing roller in a short time and usage for addressing the temperature drop in the fixing roller during image formation; and controlling the fixing heater (see FIGS. 1 and 2 described later).

In general, an analog-to-digital (A/D) converter built in or connected to a central processing unit (CPU) for controlling an image forming apparatus is used as a method for detecting analog signals of the voltages of the external power source and the auxiliary power source, the ambient temperature, the temperatures of the fixing roller and the pressure roller, and the like. Such analog signals need to be detected with high accuracy to perform accurate control. In particular, an input source voltage needs to be detected with accuracy of ±1 volt with respect to an input source voltage of alternating current (AC) 100 volts. When using an A/D converter or the like that is built in the CPU and having relatively poor accuracy, it is necessary to correct and reduce a conversion error that occurs during A/D conversion.

Conventional image forming apparatuses use an A/D converter built in a controlling CPU or connected to an external device, as a method for detecting analog signals corresponding to voltages of an input power source (a commercial alternating current source) and of an auxiliary power source, an ambient temperature, temperatures of a fixing roller and a pressure roller, and the like. Such analog signals need to be detected with high accuracy to perform accurate control. In particular, an input source voltage needs to be detected with high accuracy of +1 volt with respect to an input source voltage ranging from AC 90 volts to AC 110 volts. Due to an error in a detection circuit that converts an alternating current voltage to a direct current voltage acceptable by the A/D converter, some method is necessary to reduce conversion errors that occur during A/D conversion in the subsequent stage.

Specifically, because the A/D converter has conversion errors (such as an offset error, a full scale error, and a nonlinearity error) that occur during conversion, the conversion errors are contained in digital values. The offset error is an analog input voltage that is converted to a minimum digital value (e.g., 0) by the A/D conversion at the A/D converter. The full scale error is an analog input value that is converted to a maximum digital value (FS) by A/D conversion at the A/D converter. The nonlinearity error is caused because a digital value of an analog voltage input to the A/D converter varies in a non-linear manner. For example, with a 10-bit A/D converter causing a conversion error of 10 least significant bits (LSB), a converted value obtained by converting an input voltage includes 10/1023 (about 1%) conversion error. Further, an error in a reference source of the A/D converter is added to the converted value. In general, a high-performance A/D converter generating small conversion errors is combined with a high-accuracy reference source, as a method for detecting an analog signal with high accuracy. However, this method is more expensive than the method using the A/D converter built in or connected to the controlling CPU.

As described, with the method using the A/D converter built in or connected to the CPU for controlling the image forming apparatus to detect an analog signal, the A/D converter has poor conversion accuracy.

As a conventional technology for reducing the fluctuation after the A/D conversion, for example, Japanese Patent Application Laid-open No. 2005-26830 discloses an A/D converter that performs A/D conversion by switching a plurality of input ports. The A/D converter produces a high accuracy voltage fluctuating in a range smaller than that of an A/D conversion reference voltage. Based on a digital value obtained by A/D converting the high-accuracy voltage, correction is made on a digital value obtained by A/D converting a voltage input via another input port.

A conventional A/D conversion controlling device will now be described in detail with reference to FIGS. 11 and 12. FIGS. 11 and 12 are schematic diagrams of controllers of a conventional image forming apparatus, in which FIG. 11 is a schematic of a controller using a typical A/D converter, and FIG. 12 is a schematic of a controller using the A/D converter disclosed in Japanese Patent Application Laid-open No. 2005-26830.

In FIG. 11, a controller 1100 includes a one-chip microcomputer 1101 including a CPU 1102, a read only memory (ROM) 1103, a random access memory (RAM) 1104, an A/D converting unit 1105, an input switching unit 1106, an A/D conversion controlling unit 1107, and an I/O controlling unit 1109; and a reference voltage generator 1108 that generates a voltage. The ROM 1103 is a read-only storage device that stores therein a basic processing program implemented by the controller 1100, programs for controlling units such as a fixing unit and a scanner provided in the conventional image forming apparatus, and data necessary for implementing these programs. The RAM 1104 is a storage device capable of temporarily storing therein the data necessary for implementing the programs.

A power source 1111 drives the one-chip microcomputer 1101 of the controller 1100, and also provides an input to be used as a reference voltage to the reference voltage generator 1108. The voltage generated at the reference voltage generator 1108 is input to the A/D converting unit 1105 and used as an A/D conversion reference voltage.

The controller 1100 is connected, for example, to a sensor 1110 that generates analog signals for detection of the temperature and the voltage of each unit to control fixing, and to a fixing heater driving circuit 1112 connected to the one-chip microcomputer 1101 via the I/O controlling unit 1109 and turning ON/OFF a fixing heater for heating a fixing roller.

The A/D converting unit 1105 can convert a plurality of analog signal inputs to digital data one by one, by switching them in a time division manner with the input switching unit 1106 constituted by a semiconductor switch such as an analog switch. Such input switching performed by the input switching unit 1106 is controlled by the A/D conversion controlling unit 1107 in synchronism with the operation performed by the A/D converting unit 1105.

In contrast to the controller 1100 shown in FIG. 11, FIG. 12 is a schematic diagram of a controller 1200 of an image forming apparatus that employs a method for correcting the conversion errors in the A/D converter, disclosed as a correction of A/D conversion errors in Japanese Patent Application Laid-open No. 2005-26830. The controller 1200 has substantially the same configuration as the controller 1100 shown in FIG. 11, and only components being different from those of the controller 1100 are described. A power source 1202 drives the one-chip microcomputer 1101 of the controller 1200, and also provides an input to a reference voltage generator 1201.

Further, the power source 1202 provides an input to be used as an A/D conversion reference voltage to the A/D converting unit 1105. The voltage (the reference voltage) generated at the reference voltage generator 1201 is input to the A/D converting unit 1105 via the input switching unit 1106 and used for correcting conversion errors in the A/D converting unit 1105.

FIG. 13 is a graph of conversion characteristics regarding conversion errors in a typical A/D converter. In general, as a method for calculating an analog input voltage from a digital value obtained by conversion at the A/D converting unit 1105 shown in FIG. 11, an analog input voltage is calculated from a digital value based on the A/D ideal conversion characteristics shown in FIG. 13. This method performs calculation, provided that an analog input voltage is 0 volts for a minimum digital value (0), and that an analog input voltage for a maximum digital value (FS) is equal to a reference voltage (Vref) of the A/D converting unit 1105.

As to an analog input voltage V calculated from a digital value D, its converted value V' is calculated based on the ideal A/D conversion characteristics shown in FIG. 13, using Equation 1:

$$V' = Vref/FS \times D$$

where V is an analog input voltage (an input from the sensor 1110 serving as a temperature sensor, a voltage sensor, or the like) to be A/D converted, and D is a digital value of V.

As described, the A/D converter that converts an analog input voltage to a digital value generally has an offset error, a full scale error, and a nonlinearity error due to the characteristics of a circuit in the A/D converter. This causes conversion errors as shown in FIG. 13 between a voltage (V') calculated as an analog input voltage based on the ideal A/D conversion characteristics shown in FIG. 13 using the digital value (D), which is obtained by A/D converting the actual analog input voltage (V), and the voltage (V) calculated as an analog input voltage based on the actual A/D conversion characteristics shown in FIG. 13 using the digital value (D).

When the reference voltage (Vref) of the A/D converter is contained in the equation, high accuracy is required for Vref as well. Some high-accuracy A/D converters have functions of reducing these conversion errors generated inside the converter, and of being capable of adjusting the conversion errors. However, such A/D converters are generally expensive due to complex circuitry, and also suffer from complex control.

To address this, a method has been proposed that corrects a digital value of another analog input voltage based on a digital value obtained by A/D converting a known analog input voltage, in the configuration as shown in FIG. 12. According to the conventional technology disclosed in Japanese Patent Application Laid-open No. 2005-26830, based on a digital value (D) obtained by A/D converting a known high-accuracy analog input voltage (V), a converted value (V1') corresponding to an analog input voltage (V1) is calculated using a digital value (D1) that is obtained by AD converting an unknown analog input voltage (V1).

This calculation method is expressed by Equation 2:

$$V1' = V/D \times D1$$

A/D conversion characteristics calculated by using Equation 2 are indicated as "A/D conversion characteristics of related art" in FIG. 13. With this method, a converted value corresponding to an analog input voltage can be calculated, without being affected by the fluctuation in Vref.

As described, an image forming apparatus needs to calculate a high-accuracy analog input voltage to control the power of the fixing heater to be suitable for an analog input voltage that varies depending on the environment of a connected external power source (e.g., the input voltage drop caused by using a private power generator or other power sources, or by connecting the image forming apparatus to other devices via a plurality of lines).

A typical A/D converter as disclosed in Japanese Patent Application Laid-open No. 2005-26830 corrects a digital value of an analog input voltage, based on a digital value of an analog input voltage with higher accuracy than an A/D conversion reference voltage. Because the correction is based on a single analog input voltage with higher accuracy than the A/D conversion reference voltage and its digital value, a converted value calculated by using Equation 2 fluctuates with respect to values obtained by A/D converting analog input voltages in a wide range. This poses a problem with accuracy of A/D converter, due to the lack of consideration on the nonlinearity error in the A/D converter, which will be described in detail later.

Specifically, the A/D conversion characteristics calculated by using Equation 2 (the A/D conversion characteristics of related art shown in FIG. 13) indicate the lack of consideration on the conversion errors in the A/D converter, particularly on the nonlinearity error. Thus, depending on the settings on a known analog input voltage (V), the conversion errors are further increased as an unknown analog input voltage (V1) to be A/D converted is closer to Vref. This may result in the analog input voltage (V1) exceeding the full scale error.

SUMMARY OF THE INVENTION

It is an object of the present invention to at least partially solve the problems in the conventional technology.

According to an aspect of the present invention, there is provided an analog-to-digital conversion controlling device including a voltage generating unit that generates a plurality of analog reference voltages; a converting unit that converts the analog reference voltages digital reference values, and that converts an analog input voltage input from an external device to a digital value; an equation generating unit that generates, based on the analog reference voltages and the digital reference values, an equation for correcting the analog input voltage to be converted to a digital value falling in a range of the digital reference values; and a calculating unit that calculates the analog input voltage corresponding to the digital value by using the equation generated by the equation generating unit.

According to another aspect of the present invention, there is provided an image forming apparatus which controls a unit thereof based on an analog input voltage calculated from a digital value indicating a state of the unit by the above analog-to-digital conversion controlling device.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
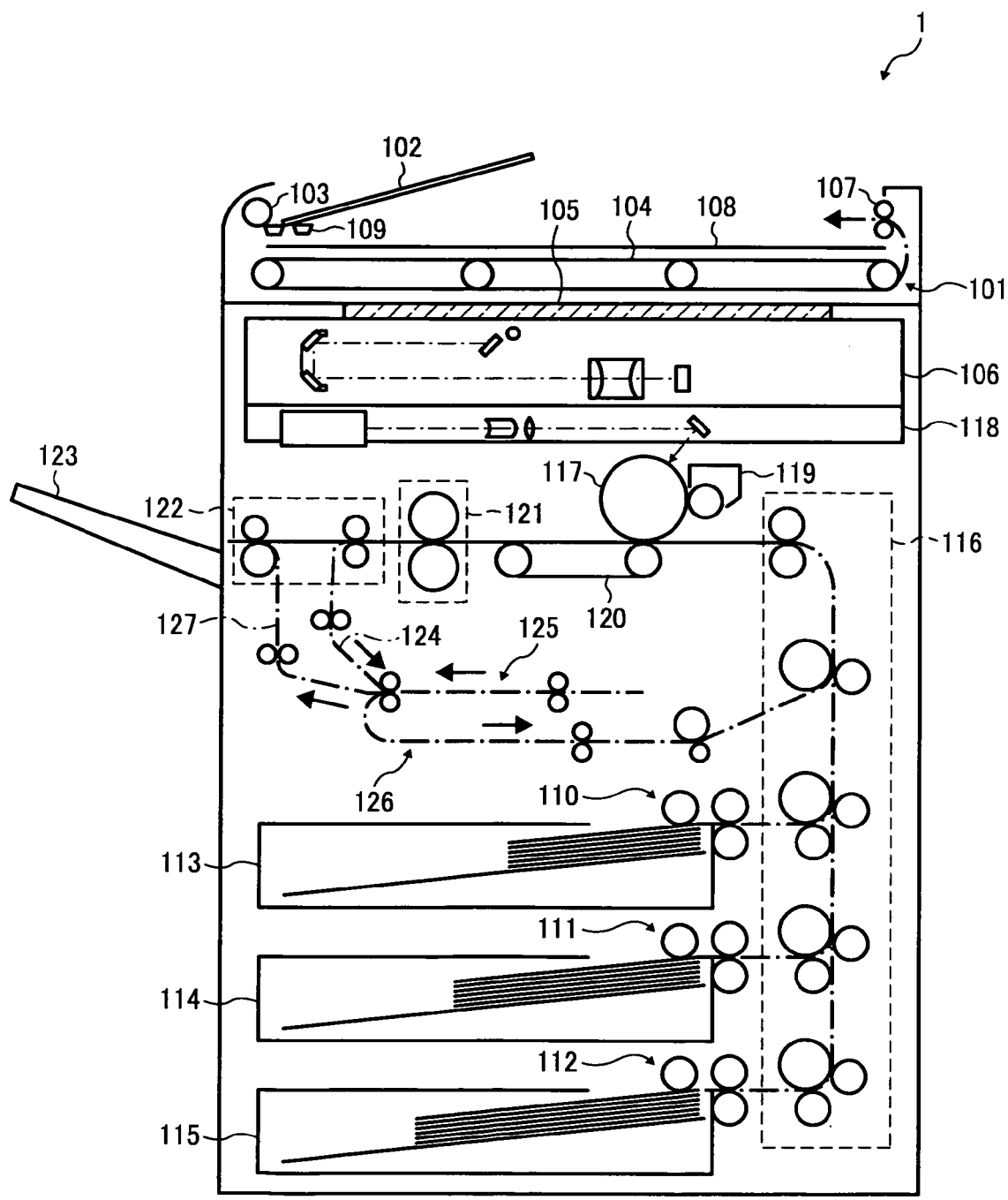
FIG. 1 is a schematic diagram side vies of a digital copier that includes an A/D conversion controlling device according to an embodiment of the present invention.

Exemplary embodiments of the present invention are described in detail with reference to FIGS. 1 to 10B. Referring to FIG. 1, the following describes an overview of a digital copier constituting an image forming apparatus using an A/D conversion controlling device according to an embodiment of the present invention.

FIG. 1 is a schematic side view of a digital copier that includes an A/D conversion controlling device according to the present embodiment. The digital copier 1 is embodied as an image forming apparatus according to the present embodiment, and serves as a so-called multifunction product. The digital copier 1 has a copy function and other functions, such as a print function and a facsimile function. By key manipulation for switching applications on an operating unit (not shown), the digital copier 1 can switchably select the copy function, the print function, and the facsimile function one by one. Selecting the copy function enables a copy mode, selecting the print function enables a print mode, and selecting the facsimile function enables a facsimile mode. The present embodiment describes, as an example, an A/D conversion controlling device used in the digital copier. Any device may be used in an image forming apparatus such as a facsimile apparatus, a copier, or a printer, as long as it uses an analog input voltage calculated from a digital value that is obtained by A/D conversion at an A/D converter, and controls each unit of the image forming apparatus.

The schematic configuration of the digital copier 1 and its operations in the copy mode are now described. In an automatic document feeder (hereinafter, "ADF") 101 shown in FIG. 1, an original placed on a platen 102 with its image surface up is fed to a predetermined position on a contact glass 105 by a paper feed roller 103 and a conveyor belt 104, when a start key on the operating unit (not shown) is pressed. The ADF 101 has a function of counting the number of originals every time an original is fed completely. Image information is read by an image reading device 106, and then the original placed on the contact glass 105 is discharged to a discharge tray 108 by the conveyor belt 104 and discharge rollers 107.

When an original setting detector 109 detects the presence of the next original on the platen 102, similarly, the bottom one of the originals stacked on the platen 102 is fed to the predetermined position on the contact glass 105 by the paper feed roller 103 and the conveyor belt 104. Image information is read by the image reading device 106, and then the original placed on the contact glass 105 is discharged to the discharge tray 108 by the conveyor belt 104 and the discharge rollers 107. The paper feed roller 103, the conveyor belt 104, and the discharge rollers 107 are driven by a conveying motor.

Any of a first paper feeder 110, a second paper feeder 111, and a third paper feeder 112, when selected, feeds a recording medium of paper sheets. The recording medium is conveyed by a vertical conveying unit 116 to a position where it comes in contact with a photosensitive body. As the photosensitive body, a photosensitive drum 117 is used for example, and rotationally moved by a main motor (not shown).

Image data read from the original by the image reading device 106 is subjected to predetermined image processing by an image processing device (not shown), and then converted to optical information by a writing unit 118. The photosensitive drum 117 is uniformly charged by a charger (not shown), and then exposed with light, i.e., optical information output from the writing unit 118. In this way, a static latent image is formed. The static latent image on the photosensitive drum 117 is developed by a developing unit 119 to be a toner image. The writing unit 118, the photosensitive drum 117, the developing unit 119, and other known devices (not shown) around the photosensitive drum 117 constitute a printer engine.

A conveyor belt 120 serves as both paper conveying means and transfer means. Upon application of a transfer bias from a power source, the conveyor belt 120 conveys the recording medium fed from the vertical conveying unit 116 with the same speed as the photosensitive drum 117, while transferring the toner image on the photosensitive drum 117 to the recording medium. The toner image is fixed to the recording medium by a fixing unit 121, and the recording medium is discharged to a discharge tray 123 by a discharge unit 122. Residual toner on the photosensitive drum 117 is cleaned by a cleaning unit (not shown) after the toner image is transferred.

The above operations are performed for copying an image on one side of a sheet in a normal mode. To copy images on both sides of a recording medium in a double-sided mode, a recording medium fed from any one of the feeder trays 113 to 115 and having an image formed on one side thereof is conveyed by the discharge unit 122 to a double-sided paper conveying path 124, not to the discharge tray 123. The recording medium is then reversed in its traveling direction by a reversing unit 125, its front and back sides are reversed, and conveyed to a double-sided paper conveying unit 126.

The recording medium, conveyed to the double-sided paper conveying unit 126, is conveyed by the double-sided paper conveying unit 126 to the vertical conveying unit 116. The recording medium is then conveyed by the vertical conveying unit 116 to a position where it comes in contact with the photosensitive drum 117. A toner image formed on the photosensitive drum 117 in a similar manner as described is transferred to a back side of the recording medium and fixed by the fixing unit 121. In this way, copy is made on both sides of the recording medium. The recording medium with its both sides copied is discharged to the discharge tray 123 by the discharge unit 122.

To discharge the recording medium with its sides reversed, the recording medium reversed in its traveling direction by the reversing unit 125 and thus having its front and back sides reversed, is conveyed through a reversed discharge paper conveying path 127, not to the double-sided paper conveying unit 126. The recording medium is then discharged to the discharge tray 123 by the discharge unit 122.

In the print mode, image data is input from the outside, instead of the image data from the image processing device. Then, an image is formed on a recording medium in a similar manner as described.

In the facsimile mode, the image data from the image reading device 106 is transmitted to a receiver by a facsimile transmitting and receiving unit (not shown). Image data sent from the receiver is received at the facsimile transmitting and receiving unit, and input to the writing unit 118, instead of the image data from the image processing device. Then, an image is formed on a recording medium in a similar manner as described.

The digital copier 1 includes a large capacity paper tray (hereinafter, "LCT") (not shown); a finisher that performs sorting, punching, stapling, and the like; and the operating unit that performs operations in a mode for reading an original, and sets copying magnification, the paper feeder trays, and post-processing at the finisher, and carries out display to an operator.

Figure 2:
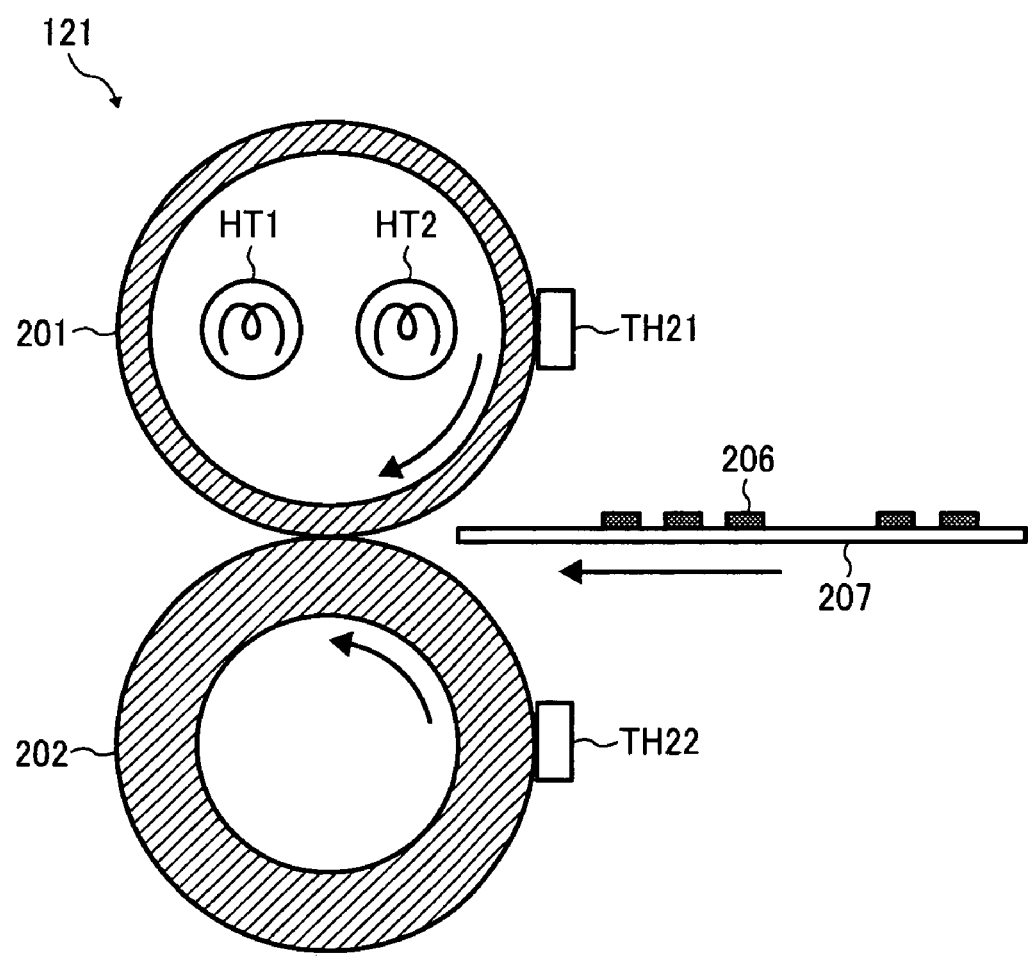
FIG. 2 is a schematic of a fixing unit shown in FIG. 1.

FIG. 2 is a schematic of the fixing unit 121. The fixing unit 121 performs a fixing function. As shown in FIG. 2, the fixing unit 121 is configured such that a pressure roller 202 constituted by an elastic member such as silicone rubber is pressed against a fixing roller 201 serving as a heating member by pressure means (not shown) at a constant force. In general, a fixing member and a pressure member are formed in roller shapes, however, either or both of the fixing and the pressure members may be formed in an endless belt, for example. In the fixing unit 121, heaters HT1 and HT2 are provided in predetermined positions. In the example shown in FIG. 2, the heaters HT1 and HT2 are provided inside the fixing roller 201, so as to heat the fixing roller 201 from inside.

The fixing roller 201 and the pressure roller 202 are driven and rotated by a drive mechanism (not shown). A temperature sensor TH21 detects a surface temperature (fixing temperature) of the fixing roller 201. A temperature sensor TH22 detects a surface temperature of the pressure roller 202. When a paper sheet 207 that carries toner 206 thereon passes through a nip portion between the fixing roller 201 and the pressure roller 202, the toner 206 is fixed to the paper sheet 207 by heat and pressure applied by the fixing roller 201 and the pressure roller 202.

The fixing heater HT2 serving as a second heating member is turned ON when the temperature of the fixing roller 201 is lower than a reference maximum temperature Tt, and mainly heats the fixing roller 201. The fixing heater HT1 serving as a first heating member is turned ON, for example, during the rise time between an OFF mode state for energy saving and a state ready for copying, or when the temperature of the fixing roller 201 may drop below a predetermined temperature Tmin that is lower than the maximum temperature Tt, and aids to heat the fixing roller 201.

Figure 3:
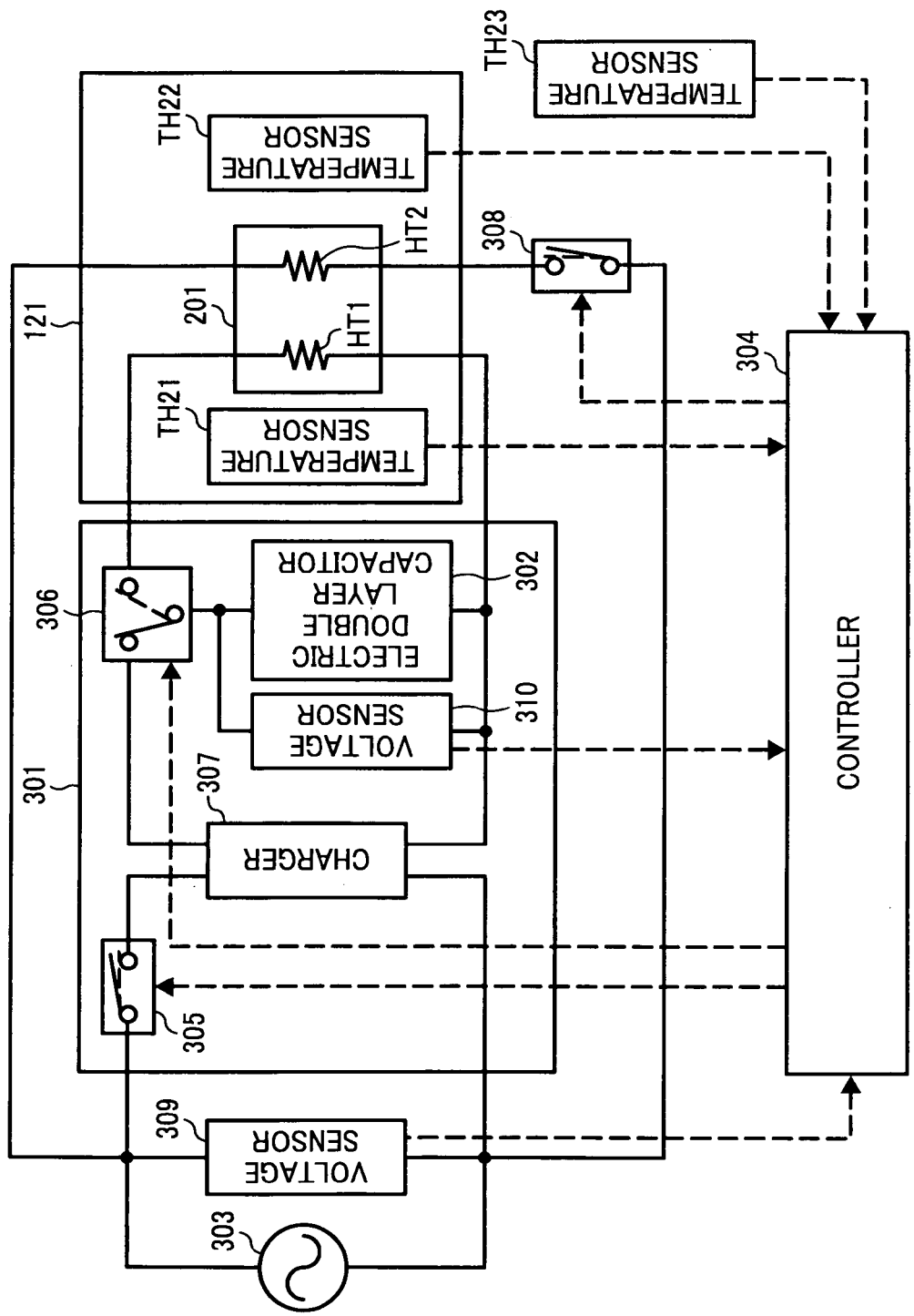
FIG. 3 is a schematic block diagram of a typical fixing controller used in the digital copier shown in FIG. 1.

FIG. 3 is a schematic block diagram of a typical fixing controller that performs temperature control of the fixing unit 121. An auxiliary power source 301 employs an electric double layer capacitor 302. The auxiliary power source 301 is charged by a normal AC power source 303, and used to turn on the fixing heater HT1. The auxiliary-power source 301 shortens the rise time up to the state ready for copying, or prevents the temperature dropping. The fixing controller has the above-described configuration because the rise time varies depending on the capacitance of the heater but the AC power source 303 can supply limited power.

AC power supplied from the AC power source 303 can be charged to the electric double layer capacitor 302 by a charger 307, when a cutoff circuit 305 and a charge and discharge switching circuit 306 are controlled by a controller 304. The AC power is also supplied to the heater HT1, when the charge and discharge switching circuit 306 is controlled by the controller 304. The AC power supplied from the AC power source 303 is also supplied to the fixing heater HT2 of the fixing unit 121, when a cutoff circuit 308 is controlled by the controller 304.

The controller 304 controls to turn ON/OFF the fixing heaters HT1 and HT2, depending on detected conditions. Those conditions include the temperature of the fixing roller 201 detected by the temperature sensor TH21, the temperature of the pressure roller 202 detected by the temperature sensor TH22, the environmental temperatures outside and inside the image forming apparatus (the room temperature and the temperature inside the apparatus) detected by a temperature sensor TH23, the voltage at the AC power source 303 detected by a voltage sensor 309, and the voltage at the electric double layer capacitor 302 detected by a voltage sensor 310. In this way, the temperature of the fixing roller 201 is controlled to the optimal temperature.

Figure 4:
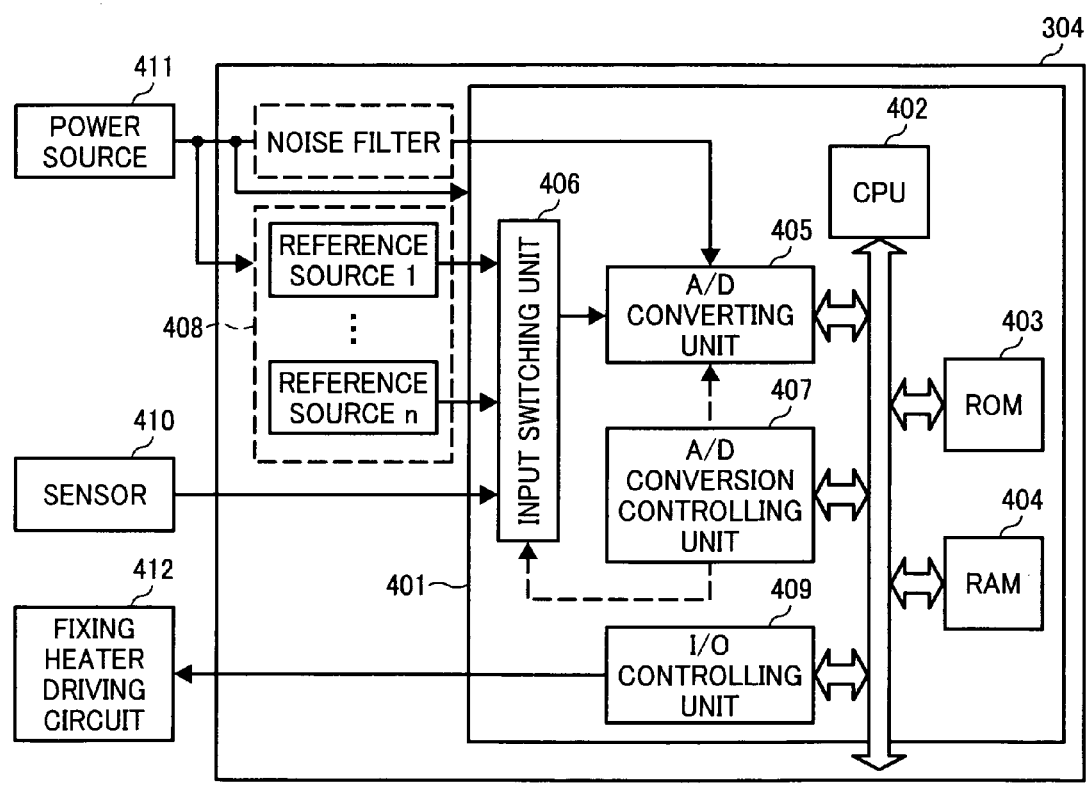
FIG. 4 is a schematic diagram of a controller of the digital copier using the A/D conversion controlling device according to the present embodiment.
Figure 5:
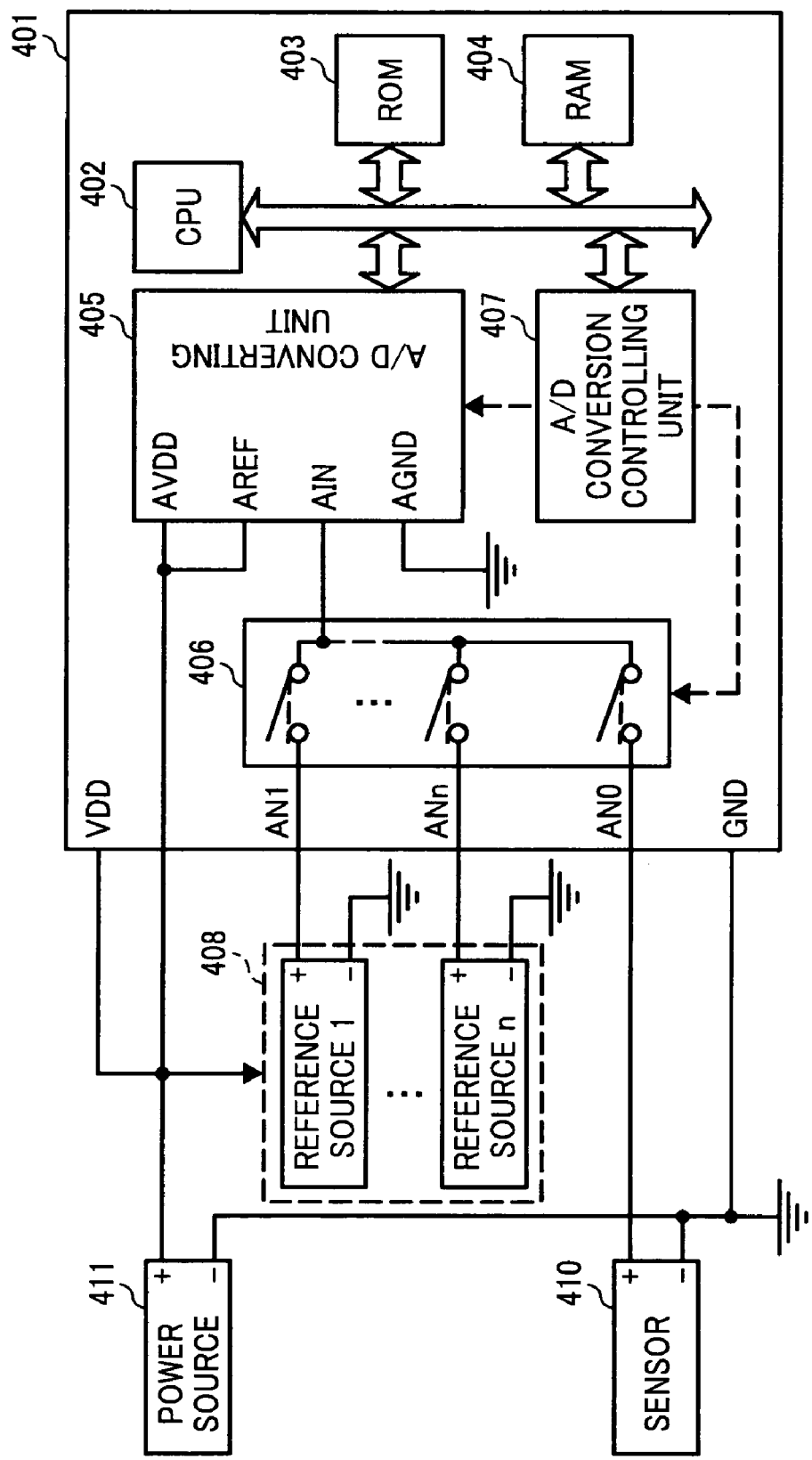
FIG. 5 is a specific diagram of the A/D conversion controlling device, included in the controller of the digital copier using the A/D conversion controlling device shown in FIG. 1.

FIG. 4 is a detailed block diagram of the controller 304 shown in FIG. 3. FIG. 5 is a detailed block diagram of the A/D conversion controlling device 401 shown in FIG. 4.

As shown in FIG. 4, in a reference voltage generating unit 408, a plurality of reference sources 1 to n (analog reference voltage sources) generate known voltages from a voltage supplied from a power source 411, using a high-accuracy reference voltage generating circuit such as a shunt regulator, and the reference voltages thus generated are input to an A/D converting unit 405 via an input switching unit 406. Although the analog reference voltages are generated in the high-accuracy reference voltage generating circuit in the present embodiment, the reference voltage generating unit 408 is not limited to this arrangement. For example, the reference voltage generating unit 408 may generate a plurality of analog reference voltages without using the shunt regulator or the like. The power source 411 drives a one-chip microcomputer 401 of the controller 304, and provides an input to be used as an A/D conversion reference voltage to the A/D converting unit 405 directly or via a filter or the like that eliminates noise. The controller 304 is connected to a fixing heater driving circuit 412 that is connected to the one-chip microcomputer 401 via an I/O controlling unit 409, and that turns ON/OFF the fixing heaters for heating the fixing roller.

As shown in FIG. 5, the one-chip microcomputer 401 has a power source input terminal VDD connected to a positive (+) terminal of the power source 411, and a ground input terminal GND connected to a negative (−) terminal of the power source 411. The one-chip microcomputer 401 is driven based on a source voltage supplied from the power source 411.

The positive terminal of the power source 411 is connected to an analog circuit power source input terminal AVDD and an A/D conversion reference power source input terminal AREF, both provided in the A/D converting unit 405. The negative terminal of the power source 411 is connected to an analog ground input terminal AGND of the A/D converting unit 405.

The A/D converting unit 405 of the one-chip microcomputer 401 converts an input voltage applied to an input terminal AIN of the A/D converting unit 405 to a digital value, based on a reference voltage applied to the input terminal AREF.

The input voltage to be applied to the input terminal AIN of the A/D converting unit 405 is selected from either an output from the reference sources 1 to n (an analog reference voltage supplied from a high-accuracy reference voltage generating circuit as having higher accuracy than the A/D conversion reference voltage supplied from the power source 411), or an output from a sensor 410 as an analog input voltage corresponding to the temperature of the fixing unit, an input voltage, or the like.

Positive terminals of the respective reference sources 1 to n of the reference voltage generating unit 408, which generates known analog reference voltages in the high-accuracy reference voltage generating circuit such as a shunt regulator using a voltage supplied from the power source 411, respectively provide inputs to channels AN1 to ANn of the input switching unit 406 of the one-chip microcomputer 401. Negative terminals of the respective reference sources 1 to n of the reference voltage generating unit 408 are connected to the GND terminal of the one-chip microcomputer 401 and the AGND terminal of the A/D converting unit 405.

A positive terminal of the sensor 410 provides an input to the channel AN0 of the input switching unit 406 of the one-chip microcomputer 401. A negative terminal of the sensor 410 is connected to the GND terminal of the one-chip microcomputer 401 and the AGND terminal of the A/D converting unit 405.

A CPU 402 controls the input switching unit 406 and the A/D converting unit 405 via an A/D conversion controlling unit 407 according to a computer program stored in a ROM 403.

From among the channels AN0 to ANn, one input channel is selected (the switch is closed) by the input switching unit 406 so as to be used for A/D conversion. A voltage input to the selected input channel is applied to the input terminal AIN of the A/D converting unit 405. The voltage thus applied to the input terminal AIN of the A/D converting unit 405 is converted to a digital value based on voltages at the input terminals AREF and AGND of the A/D converting unit 405. The digital value obtained by conversion is read out from the A/D converting unit 405 by the CPU 402, and stored in a RAM 404. In this way, by controlling the input switching unit 406, a plurality of inputs can be switched, and subjected to A/D conversion one by one with the single A/D converting unit 405.

Figure 6:
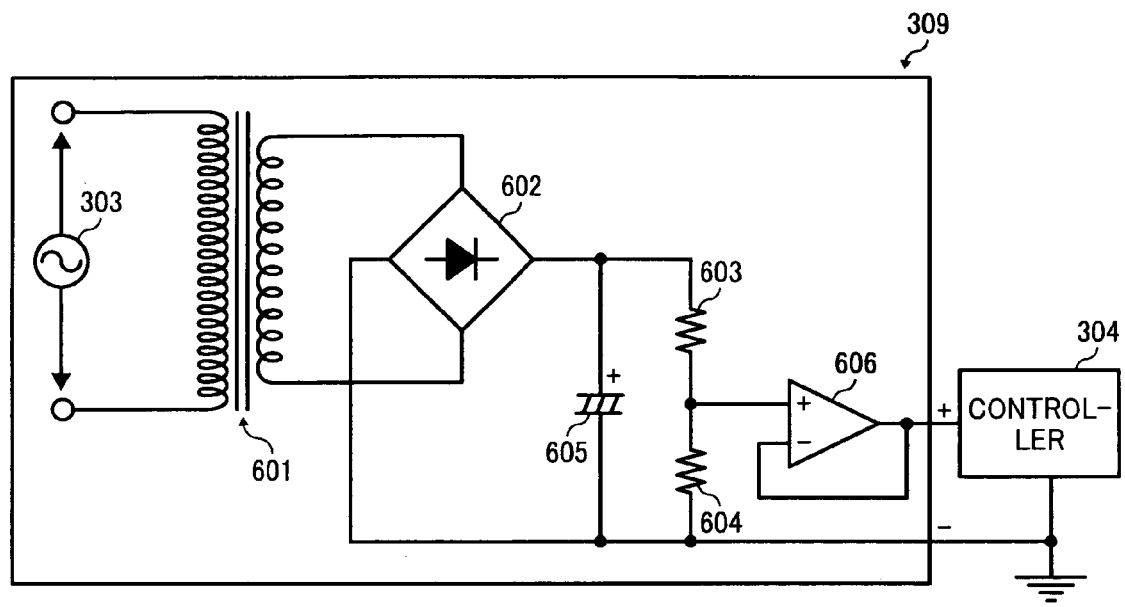
FIG. 6 is a circuit diagram of a voltage sensor that detects an output voltage of an AC power source (a sensor shown in FIG. 4 serves as a temperature sensor detecting a temperature of the fixing unit, and as a temperature sensor detecting a voltage of the AC power source)

FIG. 6 is a circuit diagram of the voltage sensor 309 that detects an output voltage from the AC power source 303 (the sensor 410 shown in FIG. 4 serves as a temperature sensor detecting a temperature of the fixing unit, and also as a voltage sensor detecting a voltage of the AC power source). Specifically, by arranging the AC power source 303 to power a transformer 601 having a separately predetermined turn ratio, the voltage sensor 309 is insulated from the AC power source 303, and the voltage is dropped to a suitable level available in an internal circuit of the voltage sensor 309. Further, an output voltage from a secondary side of the transformer 601 is full-wave rectified at a diode bridge 602, and smoothed by a smoothing capacitor 605 or divided by voltage dividers 603 and 604. The voltage is then input to the controller 304 as an analog input voltage, via a predetermined interface such as an impedance conversion circuit constituted by a buffer 606.

The voltage at the AC power source 303 and the output voltage from the voltage sensor 309 are adjusted to have a certain proportional or correlative relationship. This enables the controller 304 to determine a voltage from the AC power source 303 based on the output voltage from the voltage sensor 309.

Figure 7:
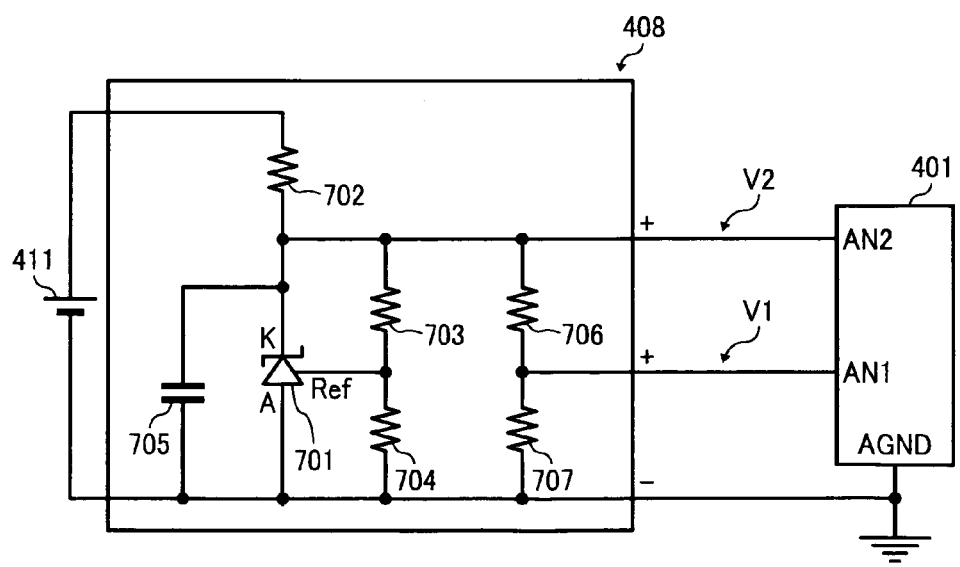
FIG. 7 is a circuit diagram of a reference voltage generating unit that generates a plurality of analog reference voltages in the A/D conversion controlling device shown in FIG. 4.

FIG. 7 is a circuit diagram of the reference voltage generating unit 408 that generates a plurality of analog reference voltages in the A/D conversion controlling device according to the present embodiment. In the reference voltage generating unit 408, the positive terminal of the power source 411 is connected to a cathode terminal (K) of a shunt regulator 701 via a resistor 702, and the negative terminal of the power source 411 is connected to an anode terminal (A) of the shunt regulator 701. A reference terminal (Ref) of the shunt regulator 701 connects the cathode and the anode terminals of the shunt regulator 701 to a voltage division-point between resistors 703 and 704. Between the cathode and the anode terminals of the shunt regulator 701 is connected a capacitor 705 for stabilizing operation. A voltage (an analog reference voltage) to be applied to the cathode terminal of the shunt regulator 701 is input to the input terminal AN2 of the one-chip microcomputer 401 in the controller 304. A voltage (an analog reference voltage) divided by resistors 706 and 707 so as to be applied to the cathode terminal of the shunt regulator 701 is input to the input terminal AN1 of the one-chip microcomputer 401 in the controller 304. Further, the anode terminal of the shunt regulator 701 is connected to the analog ground input terminal AGND of the A/D converting unit 405 in the one-chip microcomputer 401.

The shunt regulator 701 adjusts the current to be flown to the cathode terminal so that the voltage Vref at the reference terminal becomes, for example, 2.5 volts. In the circuit shown in FIG. 7, the voltage divided by the resistors 703 and 704, connected between the cathode and the anode terminals, is controlled to be Vref, and the voltage at the cathode terminal is determined by a division ratio between the resistors 703 and 704. When the ratio between the resistors 703 and 704 is R:1, an analog reference voltage V2 at the cathode terminal is given as V2=Vref×(R+1). The analog reference voltage V2 at the cathode terminal is divided by the resistors 706 and 707, so that an analog reference voltage V1 is generated. When the ratio between the resistors 706 and 707 is S:1, the analog reference voltage V1 at the voltage division point is given as V1=V2/(S+1).

The cathode terminal of the shunt regulator 701 is connected to the input terminal AN2 of the one-chip microcomputer 401, so that the analog reference voltage V2 from the cathode terminal is applied to the input terminal AN2. The voltage division point where the analog reference voltage V2 from the cathode terminal of the shunt regulator 701 is divided by the resistors 706 and 707 is connected to the input terminal AN1 of the one-chip microcomputer 401, so that the analog reference voltage V1 is applied to the input terminal AN1. The resistor 702 is provided to reduce the voltage difference between the voltage at the power source 411 and the analog reference voltage V2 at the cathode terminal of the shunt regulator 701.

By using a shunt regulator having the reference voltage Vref with voltage accuracy of, for example, ±0.5% as the shunt regulator 701 and resistors with high accuracy of, for example, ±0.1% as the resistors 703, 704, 706, and 707, the reference voltage generating unit 408 can generate the analog reference voltages V1 and V2 with high accuracy.

In FIG. 7, two voltages: the analog reference voltages V1 and V2 are generated as an example. By preparing a plurality of resistors that divide the voltage output from the cathode terminal, an additional analog reference voltage can be easily generated with high accuracy. Alternatively, the settings on the output voltage may be changed in the circuit shown in FIG. 7 and multiple sets of such circuit may be prepared. Instead of the shunt regulator 701, a high-accuracy stepdown regulator IC with an output voltage accuracy of, for example, ±1% may be used and a voltage generated in and output from the IC may be divided by a resistor.

Figure 8:
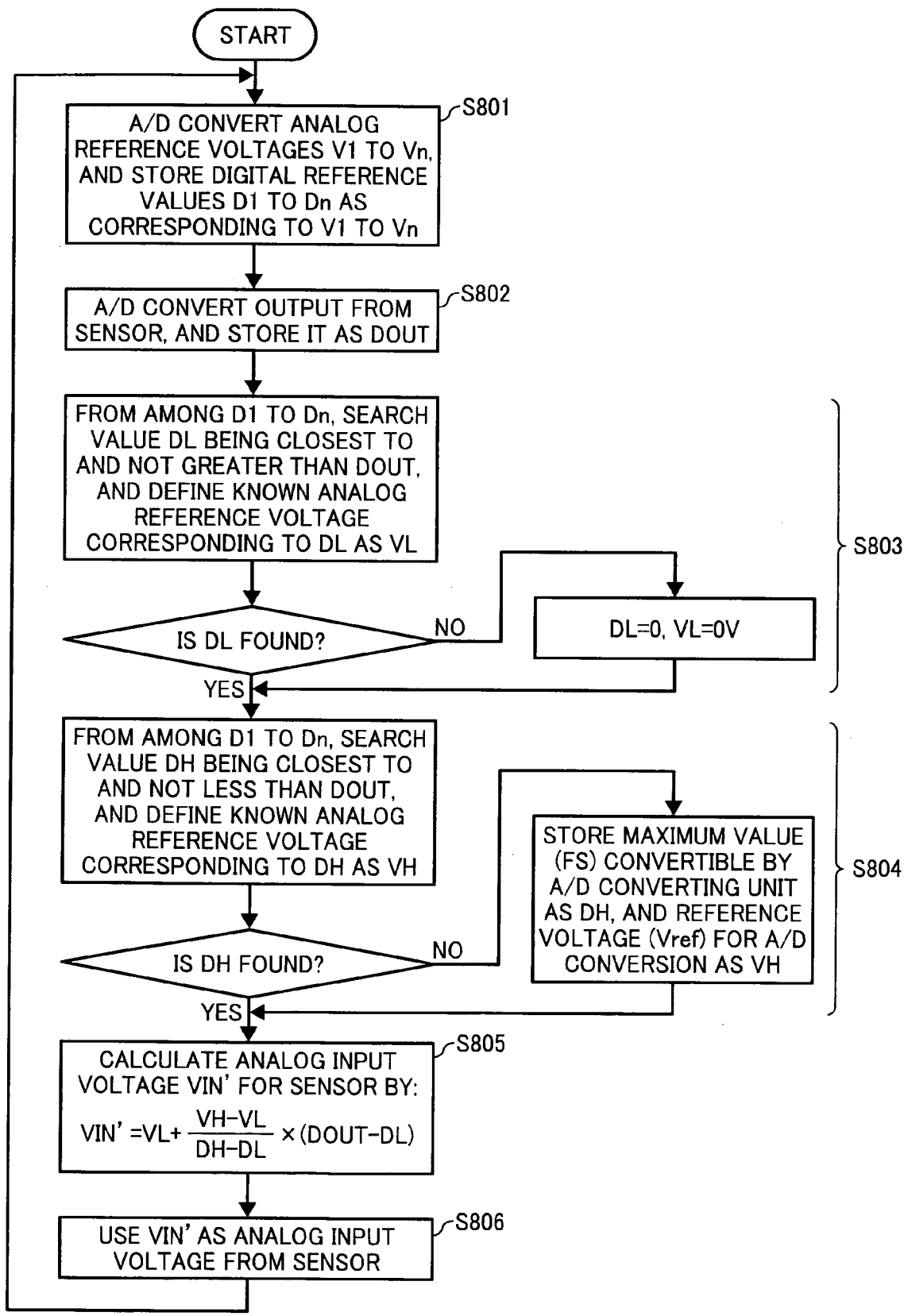
FIG. 8 is a flowchart of A/D conversion operations and control operations performed by the A/D conversion controlling device shown in FIG. 4.

FIG. 8 is a flowchart of A/D conversion operations and control operations performed by the A/D conversion controlling device according to the present invention. At Step S801, the A/D converting unit 405 of the one-chip microcomputer 401 mounted on the controller 304 converts a plurality of high-accuracy analog reference voltages V1 to Vn, supplied from the reference voltage generating unit 408, to digital reference values D1 to Dn. The CPU 402 stores in the RAM 404 of the one-chip microcomputer 401 the digital reference values D1 to Dn as corresponding to the known analog reference voltages V1 to Vn.

At Step S802, the A/D converting unit 405 of the one-chip microcomputer 401 converts an actual analog input voltage VIN from the sensor 410 to a digital value. The CPU 402 stores the digital value as DOUT in the RAM 404 of the one-chip microcomputer 401.

At Step S803, from among the digital reference values D1 to Dn stored in the RAM 404 at Step S801 as corresponding to the known analog reference voltages V1 to Vn, the CPU 402 searches a value being closest to and not greater than DOUT, obtained at Step S802 as a digital value of the actual analog input voltage VIN output from the sensor 410. A digital reference value DL thus calculated and a known analog reference voltage VL corresponding to the digital reference value DL are stored in the RAM 404 of the one-chip microcomputer 401. If a digital reference value DL can not be calculated, 0 is stored as the digital reference value DL, and 0 volts is stored as the known analog reference voltage VL.

At Step S804, from among the digital reference values D1 to Dn stored in the RAM 404 at Step S801 as corresponding to the known analog reference voltages V1 to Vn, the CPU 402 searches a value being closest to and not less than DOUT, obtained at Step S802 as a digital value of the actual analog input voltage VIN output from the sensor 410. A digital reference value DH thus calculated and a known analog reference voltage VH corresponding to the digital reference value DH are stored in the RAM 404 of the one-chip microcomputer 401. If a digital reference value DH can not be calculated, the CPU 402 stores the maximum value (FS) of the digital reference value convertible by the A/D converting unit 405 as the digital reference value DH, and the A/D conversion reference voltage (Vref) as the known analog reference voltage VH.

At Step S805, based on the digital reference value DL and its analog reference voltage VL and the digital value DH and its analog reference voltage VA, the CPU 402 generates Equation 1 for performing linearity correction for the difference between two points, i.e., the digital reference value DL and the digital reference value DH, calculated at Steps S803 and S804 as being closest to the digital value DOUT of the actual analog input voltage VIN from the sensor 410. With Equation 1 thus generated, the CPU 402 calculates an analog input voltage VIN' for the digital value DOUT of the actual analog input voltage VIN output from the sensor 410. In the present embodiment, the analog input voltage VIN' for the digital value DOUT is calculated with the equation for performing linear correction for the two points. However, the arrangement is not limited to this. For example, digital reference values for three or more known analog reference voltages are searched at Steps S803 and S804, and an equation for correcting three or more points by a linear or curve line is generated based on three or more known analog reference voltages and their digital reference values. In this way, the analog input voltage VIN' for the digital value DOUT may be calculated with the equation generated.

$$VIN'=VL+(VH-VL)/(DH-DL)\times(DOUT-DL)$$

At Step S806, the CPU 402 of the one-chip microcomputer 401 uses the analog input voltage VIN' obtained at Step S805 as the analog input voltage VIN output from the sensor 410, and performs predetermined control (e.g., control on the fixing heater).

Figure 9:
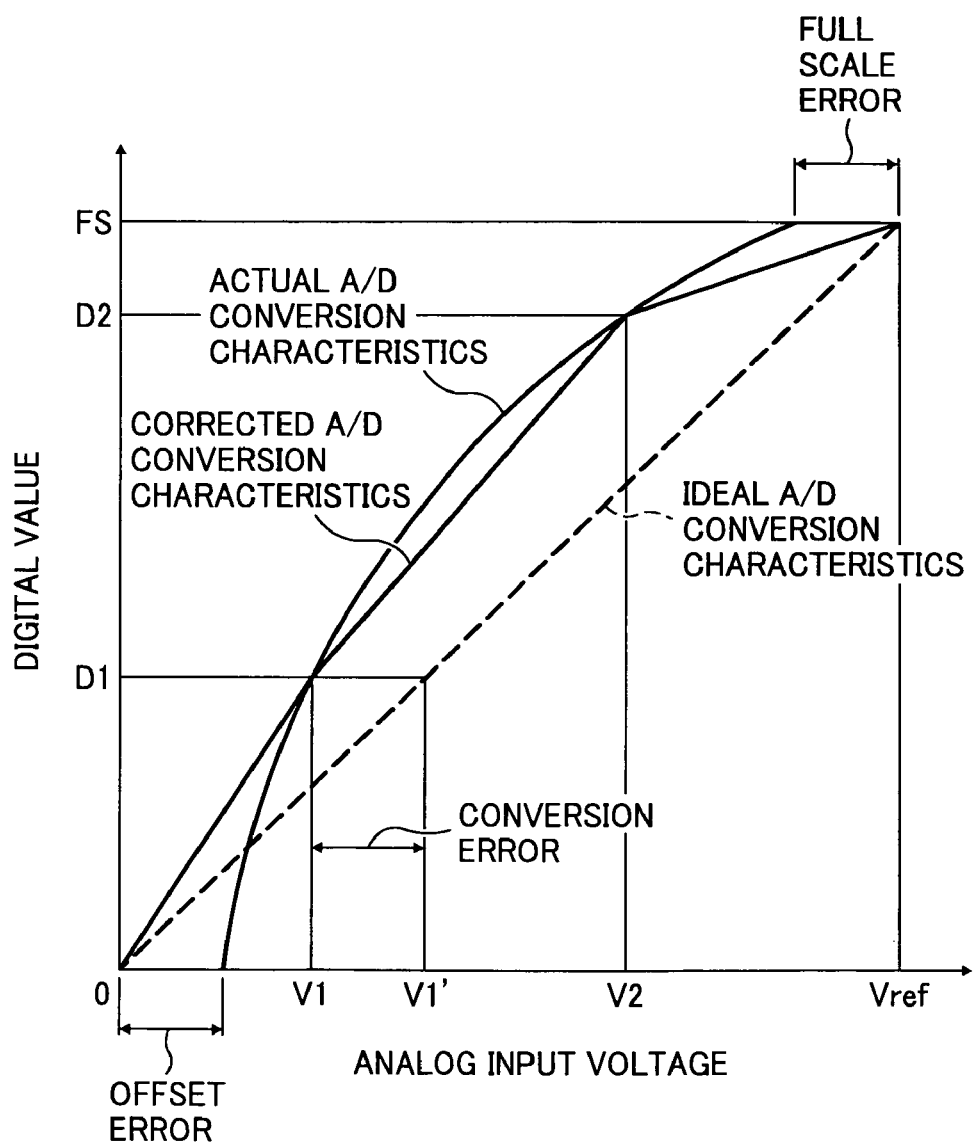
FIG. 9 is a graph of A/D conversion characteristics of an A/D converting unit according to the present embodiment.

FIG. 9 is a graph of A/D conversion characteristics of an A/D converter according to the present embodiment. The following considers a feature of the present embodiment, as shown in FIGS. 4 and 5, that the reference voltage generating unit 408 of the controller 304 generates two high-accuracy analog reference voltages V1 and V2, and performs A/D conversion with high accuracy using the analog reference voltages V1 and V2 thus generated. The analog reference voltages V1 and V2 and the A/D conversion reference voltage (Vref) satisfy Vref>V2>V1.

For example, the digital reference value D1 is obtained by A/D converting the analog reference voltage V1, and the digital reference value D2 is obtained by A/D converting the analog reference voltage V2. The CPU 402 divides the A/D conversion characteristics (a range of digital values (0 to FS) convertible from analog to digital by the A/D converting unit 405) into a plurality of segments based on the digital reference values D1 and D2 thus obtained. The CPU 402 then generates an equation for correcting A/D conversion characteristics in each of the divided segments, based on digital reference values in each segment and analog reference voltages corresponding to the digital reference values.

In FIG. 5, the output voltage from the sensor 410, i.e., the analog input voltage to be A/D converted, is VIN and a digital value obtained by A/D converting VIN is DOUT. An equation is generated for correcting the A/D conversion characteristics in the each of the segments divided by the digital reference values D1 and D2. The analog input voltage VIN' for correction is calculated based on the digital value DOUT by the following equations.

When the digital value DOUT is not greater than the digital reference value D1 (segment 1), the minimum digital reference value (0) is obtained with the analog reference voltage 0 volts, and the digital reference value D1 is obtained with the analog reference voltage V1. Equation 3 is given:

$$VIN'=V1/D1\times DOUT$$

When the digital value DOUT is neither less than the digital reference value D1 nor greater than the digital reference value D2 (segment 2), the digital reference value D1 is obtained with the analog reference voltage V1, and the digital reference value D2 is obtained with the analog reference voltage V2. Equation 4 is given:

$$VIN'=V1+(V2-V1)/(D2-D1)\times(DOUT-D1)$$

When the digital value DOUT is not less than the digital reference value D2 (segment 3), the digital reference value D2 is obtained with the analog reference voltage V2, and the maximum digital reference value (FS) is obtained with an analog reference voltage serving as the A/D conversion reference voltage (Vref). Equation 5 is given:

$$VIN'=V2+(Vref-V2)/(FS-D2)\times(DOUT-D2)$$

For example, assume that in FIG. 9, the digital value D1 is obtained by A/D converting the analog input voltage V1 being equal to the high-accuracy analog reference voltage. With the method for calculating an analog input voltage for the digital value D1 based on the ideal A/D conversion characteristics shown in FIG. 9, an analog input voltage V1' is calculated, so that a conversion error occurs. However, according to the present embodiment using the method for calculating an analog input voltage based on the A/D conversion characteristics calculated by using Equations 3 and 4, the analog input voltage V1 is calculated for the digital value D1, so that no conversion error occurs.

With the method for calculating the analog input voltage VIN' based on the A/D conversion characteristics according to the present embodiment, the analog input voltage VIN' can be calculated with higher accuracy, as the analog input voltage VIN to be A/D converted is closer to the analog reference voltages V1 and V2 generated by the reference voltage generating unit 408.

In an image forming apparatus that controls the output voltage from the sensor 410 shown in FIG. 5 to be close to a target value or that controls to switch the operation when the output voltage from the sensor 410 is near a threshold, a voltage of the target value or of the threshold is generated by the reference voltage generating unit 408. This enables high accuracy control according to the accuracy of the output voltage from the reference voltage generating unit 408.

As to the A/D conversion characteristics (the segments 1 and 2 shown in FIG. 9) according to the present embodiment, the A/D conversion reference voltage (Vref) is not included in Equations 3 and 4. This enables to limit the effect of the fluctuation in the A/D conversion reference voltage. Particularly, when the reference voltage generating unit 408 generates the analog reference voltage V2 being not less than an upper limit voltage of the analog input voltage VIN to be A/D converted and being not greater than a voltage with the full scale error extracted, high accuracy detection is possible without causing the full scale error.

This eliminates the need to prepare a high-accuracy power source for the A/D conversion reference voltage Vref. As shown in FIG. 9, the offset error is included only in the segment 1. Thus, by causing the reference voltage generating unit 408 to generate the analog reference voltage V1 being not greater than a lower limit voltage of the analog input voltage VIN to be A/D converted and being not less than the offset error, high accuracy detection is possible without causing the offset error. Further, by generating an additional analog reference voltage in the reference voltage generating unit 408 and subdividing the segment 2, detection can be made with ease and high accuracy at more points. In this case, the non-linearity error is further reduced in the segment 2.

As described, the image forming apparatus according to the present embodiment includes the A/D converting unit 405; the CPU 402; the memories (the ROM 403 and the RAM 404); the input switching unit 406 that includes the high-accuracy reference sources, and that selects one of the output voltages from the reference sources and from the sensor 410, and outputs it to the A/D converting unit 405; the power source 411 that powers the A/D converting unit 405, the reference voltage generating unit 408, and other circuits; and the sensor 410 (e.g., a temperature sensor, and a voltage sensor detecting an input voltage) that outputs an analog input voltage to be A/D converted, as shown in FIG. 5. In this arrangement, a plurality of high-accuracy analog reference voltages are input from the high-accuracy reference sources to the A/D converting unit 405 and are A/D converted, so that digital reference values are calculated. Further, the output voltage (the analog input voltage) from the sensor 410 is A/D converted. Using the equations based on the digital reference values and the high-accuracy analog reference voltages thus supplied, the output voltage from the sensor 410 is calculated based on the digital value that is obtained by A/D converting the output voltage from the sensor 410.

According to the above arrangement, it is possible to calculate an analog input voltage from a digital value considering the conversion error, specifically, the nonlinearity error that occurs when the analog input voltage is converted to the digital value based on the A/D conversion characteristics of the A/D converter. This provides improved accuracy in calculating an analog input voltage from a digital value. Further, the range between the highest and the lowest output voltages of the analog reference voltages output from the high-accuracy reference voltage generating unit 408 is used as an effective voltage range where an analog input voltage from the sensor 410 can be calculated. In this way, the output from the sensor 410 achieves high accuracy, not causing the full scale error and the offset error of the A/D converting unit 405. This provides improve accuracy in calculating an analog input voltage from a digital value, limiting the effects of the fluctuation in the reference voltage to be applied to the A/D converting unit 405. As to the high-accuracy analog reference voltages output from the high-accuracy reference voltage generating unit 408, at least one analog reference voltage is made to be equal to an analog input voltage that needs to be detected with the highest accuracy among the output voltages from the sensor 410. This prevents occurrence of the nonlinearity error of the A/D converting unit 405, thus achieving improved accuracy in calculating an analog input voltage.

Modification

The above-described embodiment describes an arrangement that an analog input voltage from the temperature sensor detecting the temperature of the fixing roller or from the voltage sensor detecting the voltage of the AC power source is calculated from a digital value that is obtained by A/D converting the analog input voltage, and a distribution of usage power from the auxiliary power source to the fixing unit is determined using the calculated analog input voltage. The present invention is not limited to this arrangement. For example, when the image reading device of the image forming apparatus draws power from the auxiliary power source and driven, and a distribution of usage power from the auxiliary power source to the image reading device is determined, the image reading device can be controlled with an analog input voltage calculated by the A/D conversion controlling device according to the present embodiment. This modification of the present invention is basically the same as the above-described embodiment, except that power is supplied from the auxiliary power source to the image reading device. Thus, processes being different from those of the above-described embodiment are described.

Figure 10A:
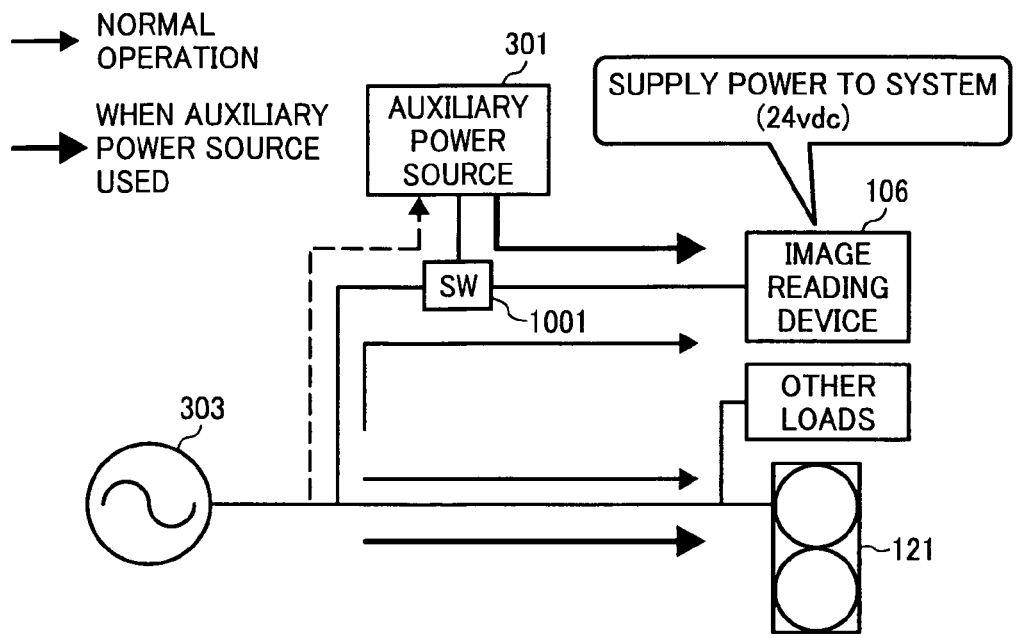
FIG. 10A is a schematic of an exemplary process for supplying power in the digital copier according to a modification of the present invention.
Figure 10B:
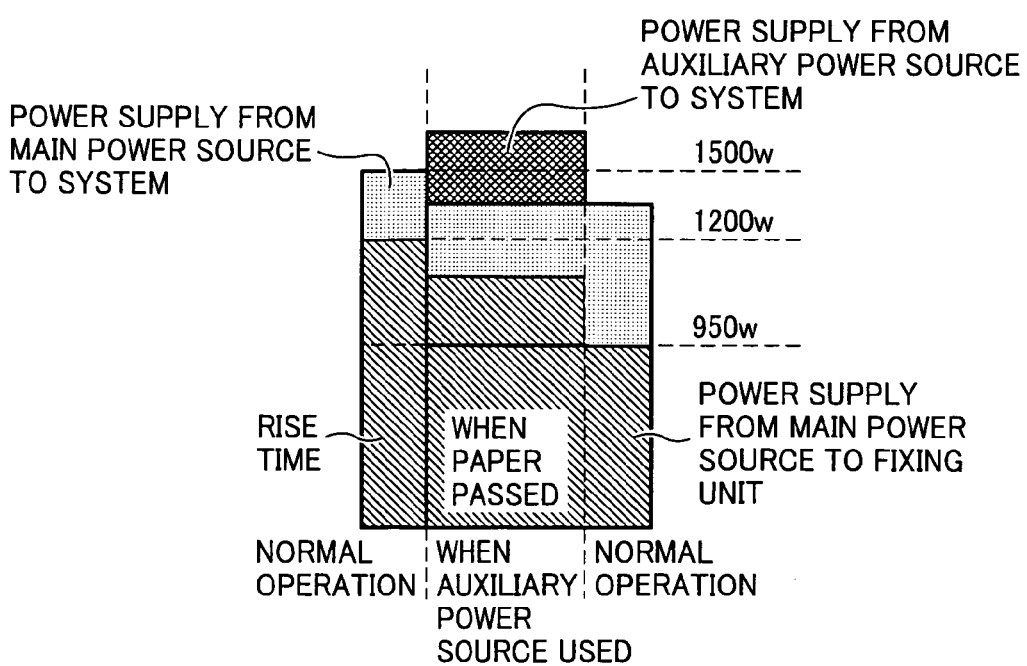
FIG. 10B is an exemplary view for explaining power levels supplied from the AC power source and an auxiliary power source to loads.
Figure 11:
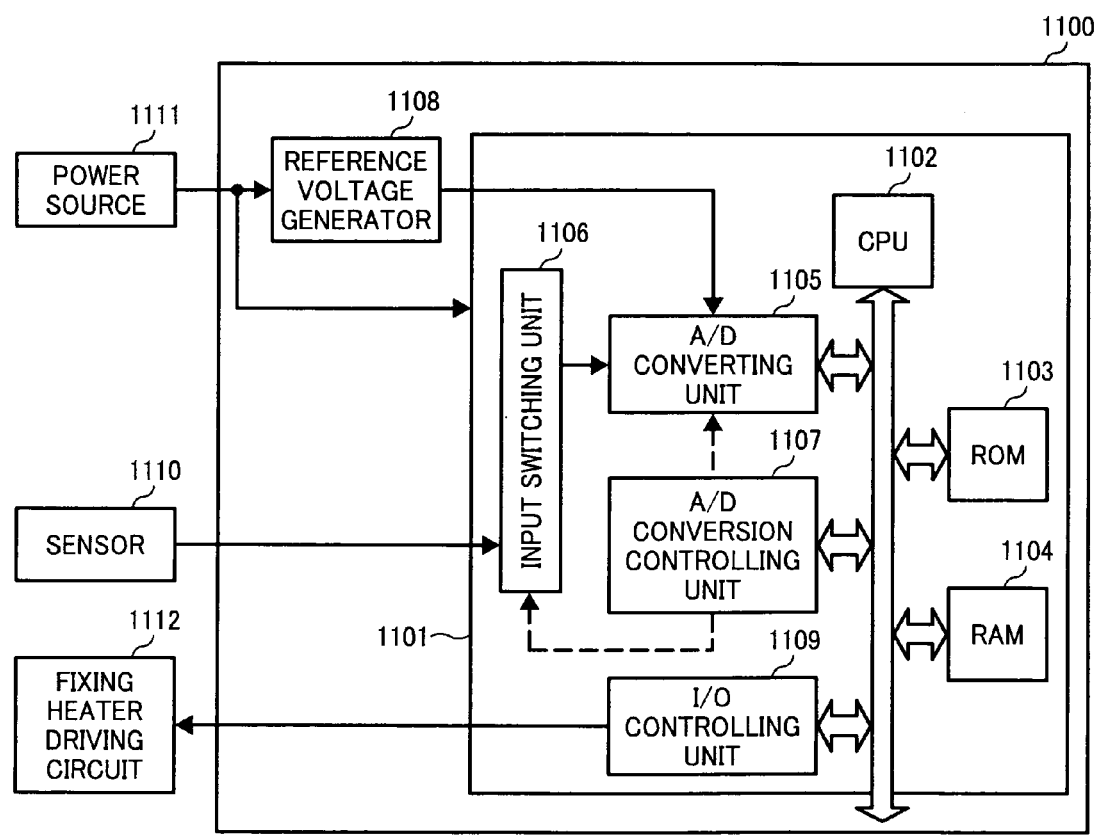
FIG. 11 is a schematic diagram of a fixing controller using a typical A/D converter included in a conventional image forming apparatus.
Figure 12:
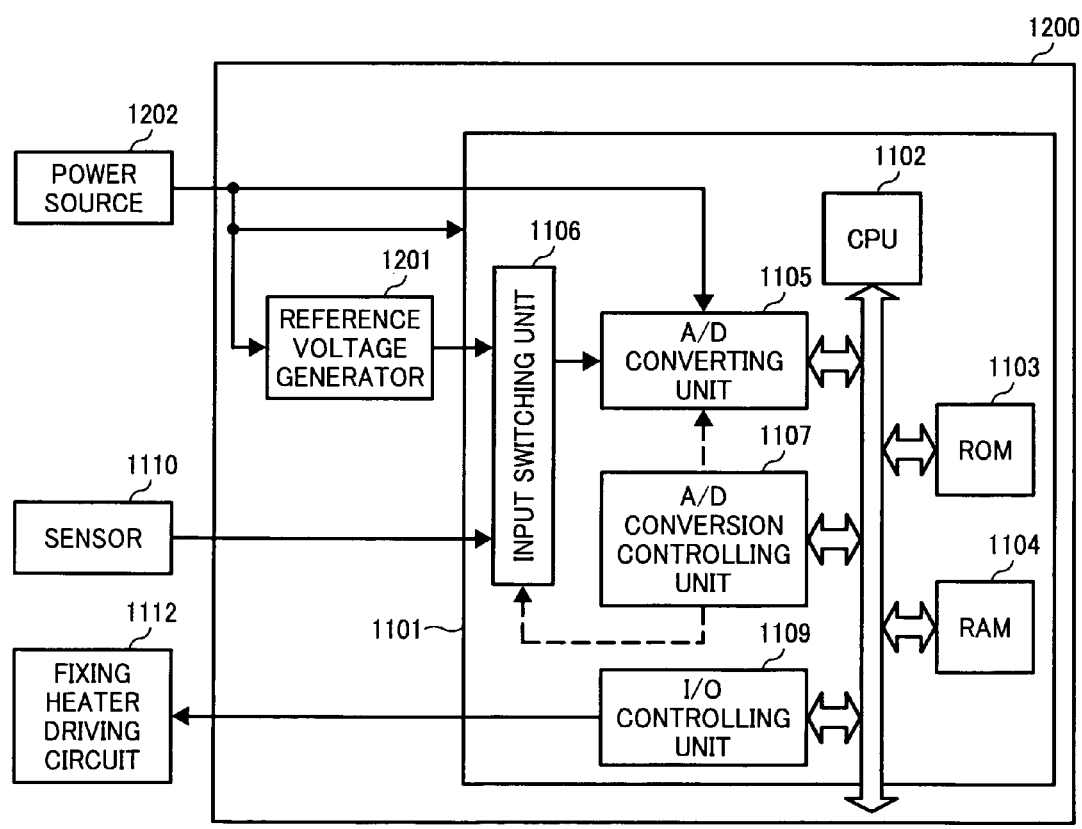
FIG. 12 is a schematic of a controller using an A/D converter disclosed in Japanese Patent Application Laid-open No. 2005-26830.
Figure 13:
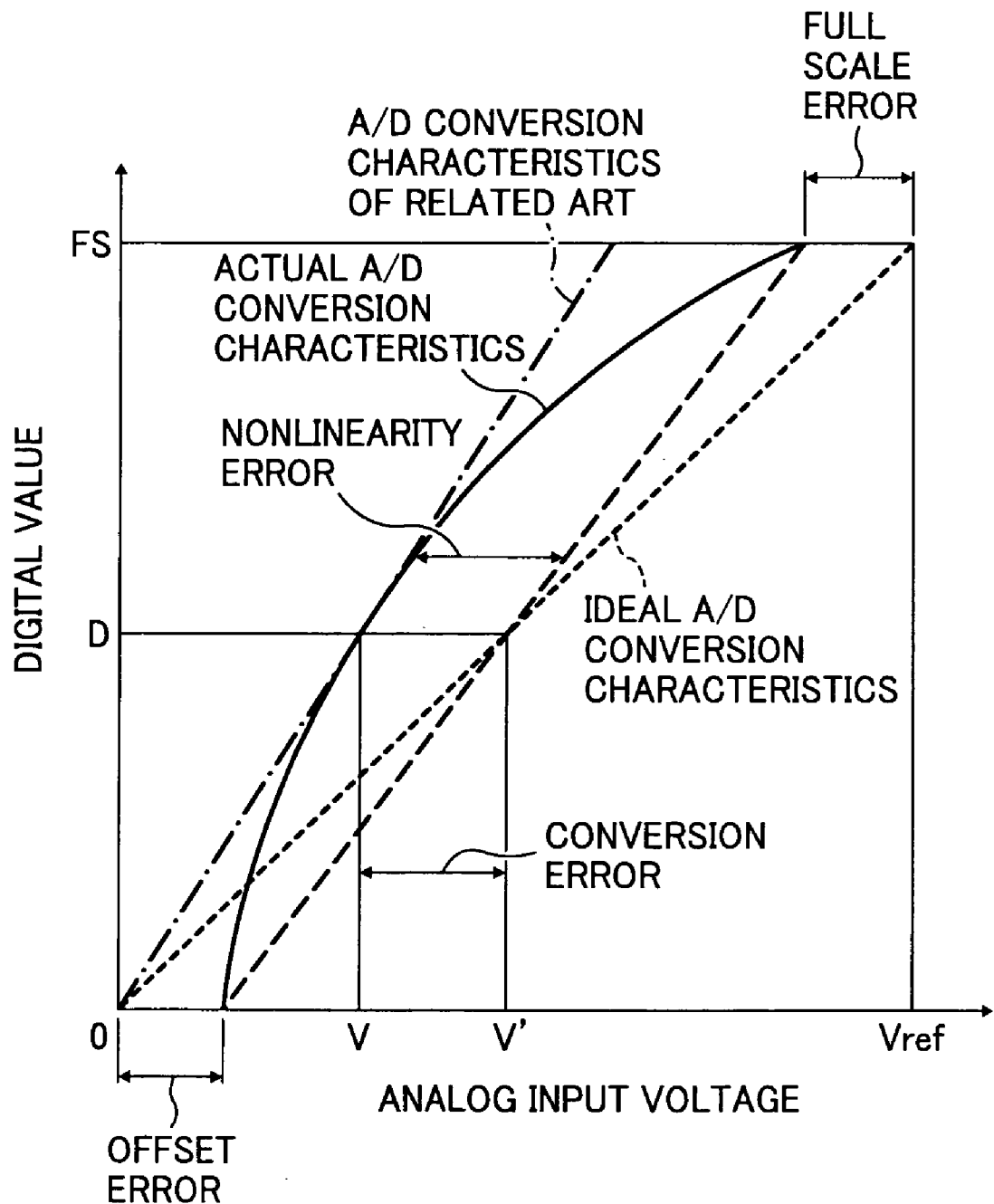
FIG. 13 is a graph of conversion characteristics regarding conversion errors of a typical A/D converter.

Referring to FIGS. 10A and 10B, the following describes processes for supplying power to the image reading device 106, the fixing unit 121, and other loads of the digital copier 1 according to the present modification. FIG. 10A is a schematic of an exemplary process for supplying power in the digital copier according to the present modification. FIG. 10B is an exemplary view for explaining power levels supplied from the AC power source and the auxiliary power source to the loads.

The AC power source 303 serving as a main power source drives the image reading-device 106, the fixing unit 121, the printer engine, various motors, and other loads. The auxiliary power source 301, serving as a charging unit capable of charging and discharging, is charged by drawing power from the AC power source 303, and drives the loads by the charged power. In FIG. 10A, the auxiliary power source 301 is a capacitor, but may also serve as a storage battery. Examples of the capacitor include aluminum electrolytic capacitors and electric double layer capacitors that have a relatively large capacitance. A switch 1001 switches ON/OFF for charging the auxiliary power source 301 with the AC power source 303, and ON/OFF for supplying power from the auxiliary power source 301. For example, the switch 1001 connects a common contact point at the auxiliary power source 301 to a contact point at the AC power source 303, to a contact point at the image reading device 106, and to a contact point not connected to none of these. The functions of the switch 1001 may be implemented by combining two or more relays or field effect transistors (FETs). In the present modification, the AC power source 303 powers: a system including the image reading device 106; other loads; and the fixing unit 121 by turning off the switch 1001 during normal operation such as the rise time. When the AC power source 303 can afford to supply sufficient power, the switch 1001 establishes a connection to the contact point at the AC power source 303 to charge the auxiliary power source 301. When using the auxiliary power source for operating the image reading device 106 and the fixing unit 121 simultaneously, the switch 1101 establishes a connection to the contact point at the image reading device 106, so as to draw power from the auxiliary power source 301 and drive the image reading device 106. In this way, the amount of power supplied from the the auxiliary power source 301 to the fixing unit 121 is increased.

According to an aspect of the present invention, based on a plurality of analog reference voltages and a plurality of digital reference voltages obtained by A/D converting the analog reference voltages, an equation for correcting an analog input voltage for a digital value falling in a range of the digital reference values is generated. With the equation generated, the analog input voltage corresponding to the digital value is calculated. In this way, an analog input voltage can be calculated from a digital value considering the conversion errors, specifically, the nonlinearity error that occurs when the analog input voltage is converted to the digital value based on the A/D conversion characteristics in an A/D converter. This provides improved accuracy in calculating an analog input voltage from a digital value.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An analog-to-digital conversion controlling device comprising:
a voltage generating unit that generates a plurality of analog reference voltages;
a converting unit that converts the analog reference voltages digital reference values, and that converts an analog input voltage input from an external device to a digital value;
an equation generating unit that generates, based on the analog reference voltages and the digital reference values, an equation for correcting the analog input voltage to be converted to a digital value falling in a range of the digital reference values; and
a calculating unit that calculates the analog input voltage corresponding to the digital value by using the equation generated by the equation generating unit.

2. The analog-to-digital conversion controlling device according to claim 1, wherein the equation generating unit generates the equation, based on one of the digital reference values that is closest to and not greater than the digital value from which the analog input voltage is calculated and the analog reference voltage converted to the digital reference value, and on one of the digital reference values that is closest to and not less than the digital value and the analog reference voltage converted to the digital reference value.

3. The analog-to-digital conversion controlling device according to claim 1, wherein the voltage generating unit generates the analog reference voltages that include an analog reference voltage being equal to the analog input voltage, and that have voltage fluctuations smaller than a voltage fluctuation of the analog input voltage.

4. The analog-to-digital conversion controlling device according to claim 1, wherein the voltage generating unit generates the analog reference voltages that are not less than an upper limit of the analog input voltage, and that are less than a voltage to be converted to a maximum digital value by the converting unit.

5. The analog-to-digital conversion controlling device according to claim 1, wherein the voltage generating unit generates the analog input voltage that is not less than a lower limit of the analog input voltage, and that is greater than a voltage to be converted to a minimum digital value by the converting unit.

6. The analog-to-digital conversion controlling device according to claim 1, further comprising a dividing unit that divides a range for the digital value convertible by the converting unit into a plurality of segments based on the digital reference values converted from the analog reference voltages, wherein
the equation generating unit generates the equation for each of the segments, based on the analog reference voltages and the digital reference values converted from the analog reference voltages in each of the segments.

7. An-image forming apparatus which controls a unit thereof based on an analog input voltage calculated from a digital value indicating a state of the unit by an analog-to-digital conversion controlling device, the analog-to-digital conversion controlling device including:
a voltage generating unit that generates a plurality of analog reference voltages;
a converting unit that converts the analog reference voltages digital reference values, and that converts an analog input voltage input from an external device to a digital value;
an equation generating unit that generates, based on the analog reference voltages and the digital reference values, an equation for correcting the analog input voltage to be converted to a digital value falling in a range of the digital reference values; and
a calculating unit that calculates the analog input voltage corresponding to the digital value by using the equation generated by the equation generating unit.

* * * * *